United States Patent
Kondo et al.

(10) Patent No.: US 7,106,126 B2
(45) Date of Patent: *Sep. 12, 2006

(54) SEMICONDUCTOR INTEGRATED CIRCUIT DEVICE

(75) Inventors: Masahito Kondo, Kyoto (JP); Koichi Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/248,323

(22) Filed: Oct. 13, 2005

(65) Prior Publication Data

US 2006/0028267 A1    Feb. 9, 2006

Related U.S. Application Data

(62) Division of application No. 10/814,248, filed on Apr. 1, 2004.

(30) Foreign Application Priority Data

Apr. 4, 2003    (JP)    ............... 2003-101366

(51) Int. Cl.
*H03K 17/687*    (2006.01)

(52) U.S. Cl. ...................... 327/427; 327/436

(58) Field of Classification Search .................... None
See application file for complete search history.

(56) References Cited

U.S. PATENT DOCUMENTS

| | | | | |
|---|---|---|---|---|
| 5,862,096 A | * | 1/1999 | Yasuda et al. | ............... 365/229 |
| 6,178,101 B1 | * | 1/2001 | Shires | .......... 363/39 |
| 6,441,598 B1 | * | 8/2002 | Ivanov | ...................... 323/284 |
| 6,496,036 B1 | | 12/2002 | Kan | |
| 6,525,594 B1 | | 2/2003 | Fugate et al. | |
| 2003/0214272 A1 | * | 11/2003 | Nishimaki | .................. 323/225 |

FOREIGN PATENT DOCUMENTS

JP    10-341141 A    12/1998
JP    2002-335626 A    11/2002

* cited by examiner

*Primary Examiner*—Timothy P. Callahan
*Assistant Examiner*—Cassandra Cox
(74) *Attorney, Agent, or Firm*—Arent Fox PLLC

(57) ABSTRACT

In a conventional semiconductor integrated circuit device, a means for preventing a backflow current has a high on-state resistance, which makes it impossible to reduce the voltage loss in normal operation. A semiconductor integrated circuit device of the invention has a first MOS transistor, a second MOS transistor provided between the first MOS transistor and a power supply terminal, and a means that, in normal operation, keeps the gate of the second MOS transistor at a predetermined potential (preferably the ground potential) and that, when a backflow current is likely, turns the second MOS transistor off. This helps prevent a backflow current while reducing the voltage loss in normal operation.

1 Claim, 4 Drawing Sheets

SEMICONDUCTOR INTEGRATED CIRCUIT DEVICE

This is a divisional application which claims the benefit of pending U.S. patent application Ser. No. 10/814,248, filed Apr. 1, 2004, which is based on Japanese Patent Application No. 2003-101366 filed on Apr. 4, 2003. The disclosures of the prior applications are hereby incorporated in their entirety by reference.

BACKGROUND OF THE INVENTION

1. Field of the Invention

The present invention relates to a semiconductor integrated circuit device having a MOS transistor. More particularly, the present invention relates to a semiconductor integrated circuit device provided with a means for preventing a backflow current in a MOS transistor.

2. Description of the Prior Art

Some semiconductor integrated circuit devices incorporate a P-channel MOS transistor Q5 having a supply voltage $V_{DD}$ applied to the source and backgate thereof as shown in FIG. 4. In this MOS transistor Q5, a parasitic diode D5 is formed from the drain to the backgate.

As a result, when the MOS transistor Q5 is reversely biased, and a voltage higher than the forward voltage of the parasitic diode is applied between the source and drain, the parasitic diode D5 turns on, and a backflow current flows through the parasitic diode D5.

Various semiconductor integrated circuit devices have conventionally been proposed that are provided with a means for preventing such a backflow current. For example, in the regulator shown in FIG. 5, between, at one end, the conducting terminal t1 and backgate of a P-channel MOS transistor Q1 serving as an output transistor and, at the other, a power supply terminal 1 to which a supply voltage $V_{DD}$ is applied, there is provided a P-channel MOS transistor Q2 that functions as a power supply shut-off switch. The conducting terminal t4 of the MOS transistor Q2 is connected to the power supply terminal 1, and the conducting terminal t3, backgate, and gate of the MOS transistor Q2 is connected to the conducting terminal t1 and backgate of the MOS transistor Q1. The conducting terminal t2 of the MOS transistor Q1 is connected to an output terminal 2. In the regulator shown in FIG. 5, when a voltage higher than the supply voltage $V_{DD}$ is applied from outside to the output terminal 2, the MOS transistor Q2 turns off, and this prevents a backflow current.

On the other hand, in the output stage circuit proposed in Japanese Patent Application Laid-Open No. H10-341141, between, at one end, the conducting terminal and backgate of a P-channel MOS output transistor and, at the other, a power supply terminal to which an external supply voltage is applied, there is provided a power supply shut-off switch so that, when a supply voltage monitoring circuit recognizes a drop in the supply voltage, the power supply shut-off switch is turned off, and this prevents a backflow current.

However, in the regulator shown in FIG. 5, since the gate and conducting terminal t3 of the MOS transistor Q2 are connected together, in normal operation (the operation performed when the supply voltage $V_{DD}$ is higher than the voltage $V_{OUT}$ at the output terminal 2), it is impossible to make the voltage between the gate and conducting terminal t4 of the MOS transistor Q2 sufficiently high, and thus, in normal operation, the voltage between the conducting terminals t3 and t4 of the MOS transistor Q2 is high. This means that the on-state resistance of the MOS transistor Q2 is high in normal operation. This makes it impossible to reduce the voltage loss in normal operation.

On the other hand, in the output stage circuit proposed in Japanese Patent Application Laid-Open No. H10-341141, no consideration is given at all to the on-state resistance of the power supply shut-off switch. This makes it impossible, in a case where the on-state resistance of the power supply shut-off switch is high, to reduce the voltage loss in normal operation (the operation performed when the external supply voltage is higher than a predetermined level).

SUMMARY OF THE INVENTION

An object of the present invention is to provide a semiconductor integrated circuit device that can prevent a backflow current and that operates with low voltage loss in normal operation.

To achieve the above object, according to the present invention, a semiconductor integrated circuit device is provided with: a first MOS transistor that has a first gate, a first backgate, a first conducting region, and a second conducting region, and that has the first backgate and the first conducting region thereof electrically connected together; a second MOS transistor that has a second gate, a second backgate, a third conducting region, and a fourth conducting region, that has the second backgate and the third conducting region thereof electrically connected to the first backgate and the first conducting region, and that receives a first direct-current voltage at the fourth conducting region thereof; a comparator that compares the first direct-current voltage with a second direct-current voltage outputted from the second conducting region; and a switch that operates according to the output of the comparator so as to connect, when the first direct-current voltage is higher than the second direct-current voltage, the second gate to a predetermined potential and, when the first direct-current voltage is lower than the second direct-current voltage, the second gate to the third conducting region or to the second conducting region.

In this configuration, in a reversely-biased state, i.e., when the first direct-current voltage is lower than the second direct-current voltage, the second MOS transistor turns off, and this prevents a backflow current in the first MOS transistor. On the other hand, in normal operation, i.e., when the first direct-current voltage is higher than the second direct-current voltage, the gate of the second MOS transistor is connected to the predetermined potential, and this makes it possible to reduce the on-state resistance of the second MOS transistor. Thus, it is possible to reduce the voltage loss in normal operation. Here, the on-state resistance of the second MOS transistor is at its minimum when the gate thereof is connected to ground, and therefore, in normal operation, i.e., when the first direct-current voltage is higher than the second direct-current voltage, it is preferable that the gate of the second MOS transistor be connected to ground.

By using MOS transistors of the same conductivity as the first and second MOS transistors, it is possible to prevent, by the action of the parasitic diode formed within the second MOS transistor, the backflow current caused by the parasitic diode formed within the first MOS transistor. Since a P-channel MOS transistor can be formed in a smaller size than an N-channel MOS transistor, it is preferable to use P-channel MOS transistors as both the first and second MOS transistors.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
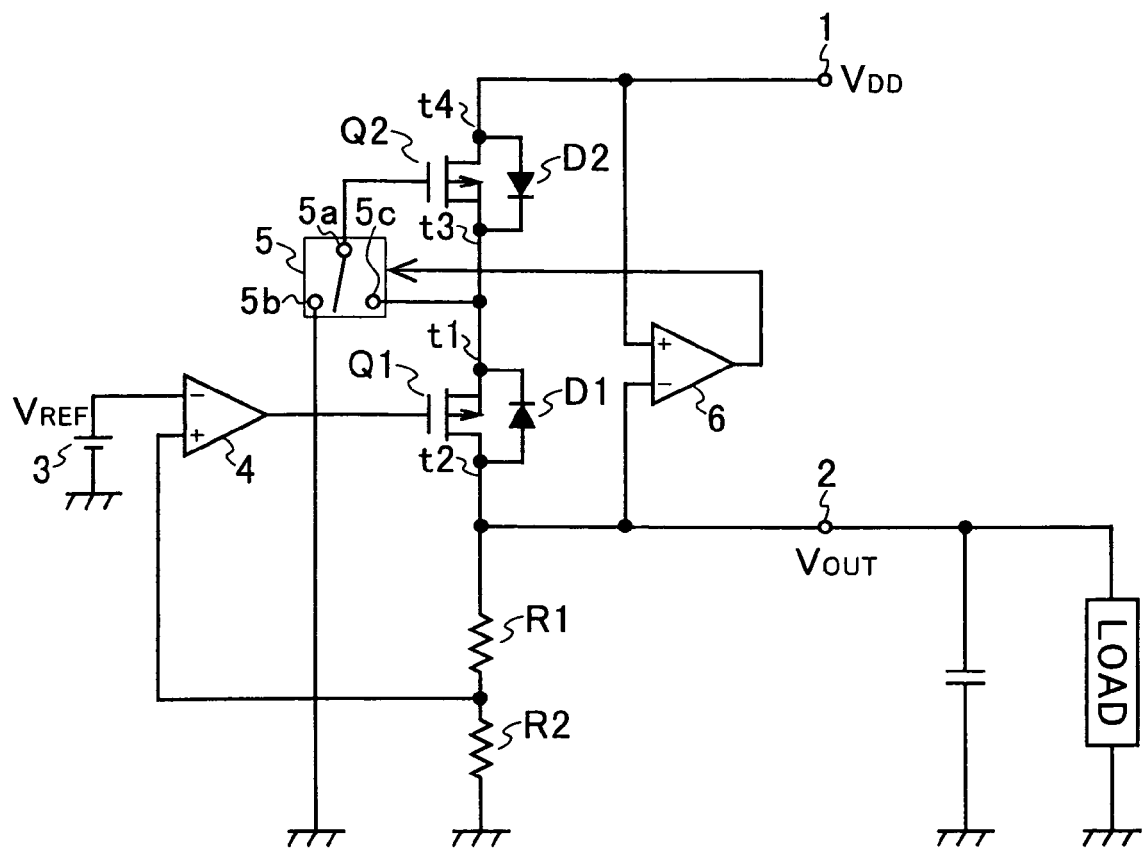
FIG. 1 is a diagram showing an example of the configuration of a regulator embodying the invention.
Figure 5:
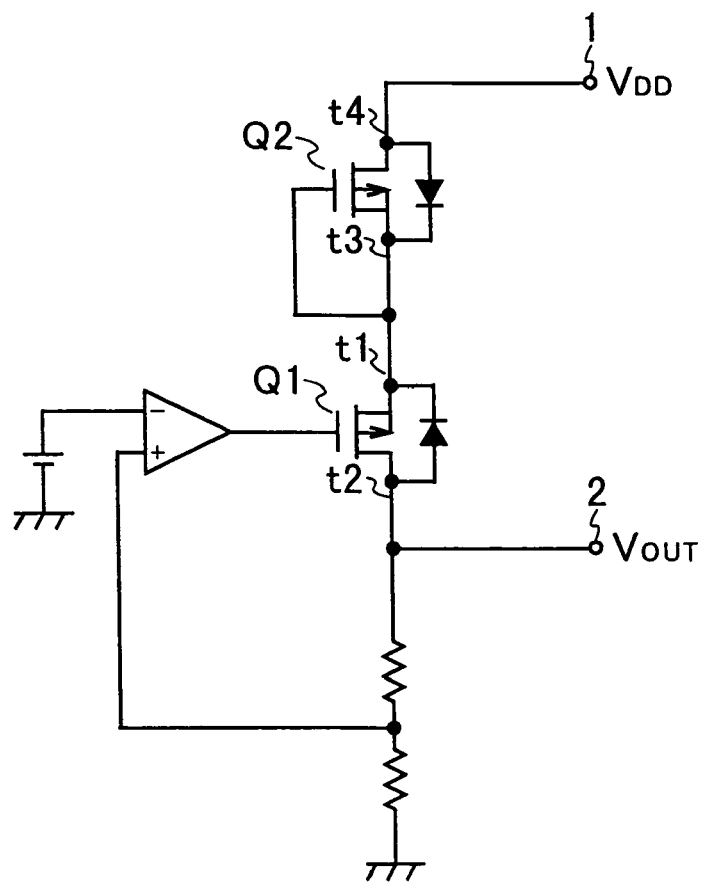
FIG. 5 is a diagram showing an example of the configuration of a conventional semiconductor integrated circuit device.

As an example of a semiconductor integrated circuit device embodying the invention, a regulator will be described below. FIG. 1 shows an example of the configuration of a regulator embodying the invention. It should be noted that, in FIG. 1, such circuit elements as are found also in FIG. 5 are identified with the same reference numerals, and their detailed explanations will not be repeated.

The regulator shown in FIG. 1 is provided with a power supply terminal 1, an output terminal 2, a reference voltage source 3, an error amplifier 4, a switch 5, a comparator 6, P-channel MOS transistors Q1 and Q2, and resistors R1 and R2.

Between the power supply terminal 1 and the output terminal 2, the MOS transistors Q1 and Q2 are connected in series. Specifically, the power supply terminal 1 is connected to the conducting terminal t4 of the MOS transistor Q2; the backgate and conducting terminal t3 of the MOS transistor Q2 is connected to the conducting terminal t1 and backgate of the MOS transistor Q1, and the conducting terminal t2 of the MOS transistor Q1 is connected to the output terminal 2. Here, it should be noted that, in the MOS transistor Q1, a parasitic diode D1 is formed in the direction indicated in the figure, i.e., from the conducting terminal t2 to the backgate, and that, in the MOS transistor Q2, a parasitic diode D2 is formed in the direction indicated in the figure, i.e., from the conducting terminal t4 to the backgate.

The resistors R1 and R2 are connected in series to form an output voltage detection circuit, of which one end is connected to the node at which the MOS transistor Q1 and the output terminal 2 are connected together, and of which the other end is grounded. The node at which the resistors R1 and R2 are connected together is connected to the non-inverting input terminal of the error amplifier 4. The reference voltage source 3 feeds a reference voltage $V_{REF}$ to the inverting input terminal of the error amplifier 4. The output signal of the error amplifier 4 is fed to the gate of the MOS transistor Q1.

The non-inverting input terminal of the comparator 6 is connected to the node at which the power supply terminal 1 and the MOS transistor Q2 are connected together, and the inverting input terminal of the comparator 6 is connected to the node at which the output terminal 2, the MOS transistor Q1, and the resistor R1 are connected together. The output signal of the comparator 6 is fed to the switch 5.

The switch 5 has contacts 5a, 5b, and 5c, and how these contacts 5a to 5c are connected together is switched according to the output of the comparator 6. The contact 5a of the switch 5 is connected to the gate of the MOS transistor Q2; the contact 5b of the switch 5 is grounded, and the contact 5c of the switch 5 is connected to the node at which the MOS transistors Q1 and Q2 are connected together.

Now, the operation of the regulator configured as described above will be described. First, a description will be given of its normal operation (the operation that it performs when the supply voltage $V_{DD}$ is higher than the voltage $V_{OUT}$ at the output terminal 2). The comparator 6 compares the supply voltage $V_{DD}$ and the voltage $V_{OUT}$ at the output terminal 2, and, if the supply voltage $V_{DD}$ is higher than the voltage $V_{OUT}$ at the output terminal 2, the comparator 6 controls the switch 5 so that the contacts 5a and 5b thereof are connected together. When the contacts 5a and 5b of the switch 5 are connected together, the gate of the MOS transistor Q2 is grounded, and thus the voltage between the gate and conducting terminal t3 of the MOS transistor Q2 is nearly equal to the supply voltage $V_{DD}$. This causes the on-state resistance of the MOS transistor Q2 to be at its minimum, and thus helps reduce the voltage loss.

The MOS transistor Q1 produces the voltage $V_{OUT}$ by subtracting the voltage equal to the voltage drop between the conducting terminals t1 and t2 thereof from the voltage fed from the conducting terminal t3 of the MOS transistor Q2, and then feeds the voltage $V_{OUT}$ to the output terminal 2.

The output voltage detection circuit, composed of the resistors R1 and R2, divides the voltage $V_{OUT}$, and the error amplifier 4 feeds a control signal commensurate with the difference between the resulting division voltage and the reference voltage $V_{REF}$ to the MOS transistor Q1. Through this feedback control, the voltage $V_{OUT}$ is kept at a predetermined level.

Next, a description will be given of the operation that the regulator performs when the supply voltage $V_{DD}$ becomes lower than the voltage $V_{OUT}$ at the output terminal 2, for example when the supply voltage $V_{DD}$ is short-circuited to ground, or when a high voltage is applied from outside to the output terminal 2. The comparator 6 compares the supply voltage $V_{DD}$ and the voltage $V_{OUT}$ at the output terminal 2, and, if the supply voltage $V_{DD}$ is lower than the voltage $V_{OUT}$ at the output terminal 2, the comparator 6 controls the switch 5 so that the contacts 5a and 5c thereof are connected together. When the contacts 5a and 5c of the switch 5 are connected together, with the potential at the conducting terminal t3 higher than the potential at the conducting terminal t4, the gate and conducting terminal t3 of the MOS transistor Q2 are short-circuited together. This turns the MOS transistor Q2 off, and thus no backflow current flows from the output terminal 2 to the power supply terminal 1.

In the regulator shown in FIG. 1, a state in which a backflow current is likely (i.e., a state in which the supply voltage $V_{DD}$ is lower than the voltage $V_{OUT}$ at the output terminal 2) is directly detected by the comparator 6, and, based of the result of this detection, the MOS transistor Q2 is turned off. This makes it possible to surely prevent a backflow current.

Moreover, MOS transistors of the same conductivity type (P-channel) are used as both the MOS transistors Q1 and Q2 so that, by the action of the parasitic diode D2 formed within the MOS transistor Q2, a backflow current caused by the parasitic diode D1 formed within the MOS transistor Q1 is prevented. By forming the MOS transistor Q2 functioning as a power supply shut-off switch in approximately the same transistor size as the MOS transistor Q1 functioning as a power transistor, it is possible to further reduce the on-state resistance of the MOS transistor Q2 in normal operation.

In a case where the supply voltage $V_{DD}$ is supplied from a car battery, due to the way in which the car battery is practically used, the supply voltage $V_{DD}$ may instantaneously drop or even be short-circuited to ground. To prevent malfunctioning of the load (for example, a microcomputer) connected to the output terminal 2 of the regulator even in such a case, a high-capacitance output capacitor is connected to the output terminal 2 to stabilize the voltage $V_{OUT}$ at the output terminal 2.

When the regulator shown in FIG. 1 is used with the supply voltage $V_{DD}$ supplied from a car battery and with a load and a high-capacitance output capacitor connected to the output terminal 2 as described above, in a circumstance where the supply voltage $V_{DD}$ drops greatly, the regulator is brought into a state in which a backflow current is likely (a state in which the supply voltage $V_{DD}$ is lower than the voltage $V_{OUT}$ at the output terminal 2). Since the regulator shown in FIG. 1 is so configured as to surely prevent a backflow current even in a state in which a backflow current is likely, it can suitably be used as a power supply device for car-mounted appliances such as car stereo systems and car navigation systems.

Figure 2:
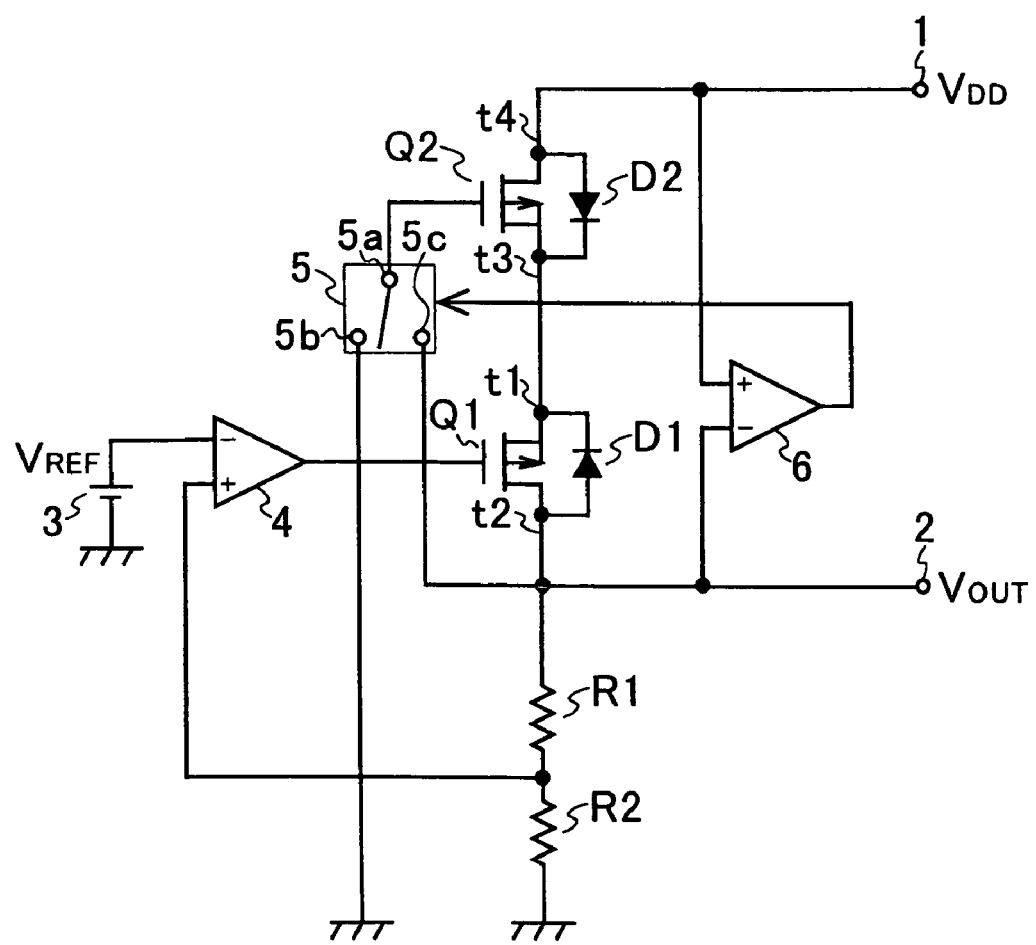
FIG. 2 is a diagram showing another example of the configuration of a regulator embodying the invention.

The same advantages as achieved by the regulator shown in FIG. 1 can be obtained also when the contact 5c of the switch 5 is connected not to the node at which the MOS transistors Q1 and Q2 are connected together but to the node at which the MOS transistor Q1, the resistor R1, the comparator 6, and the output terminal 2 are connected together as shown in FIG. 2.

Figure 3:
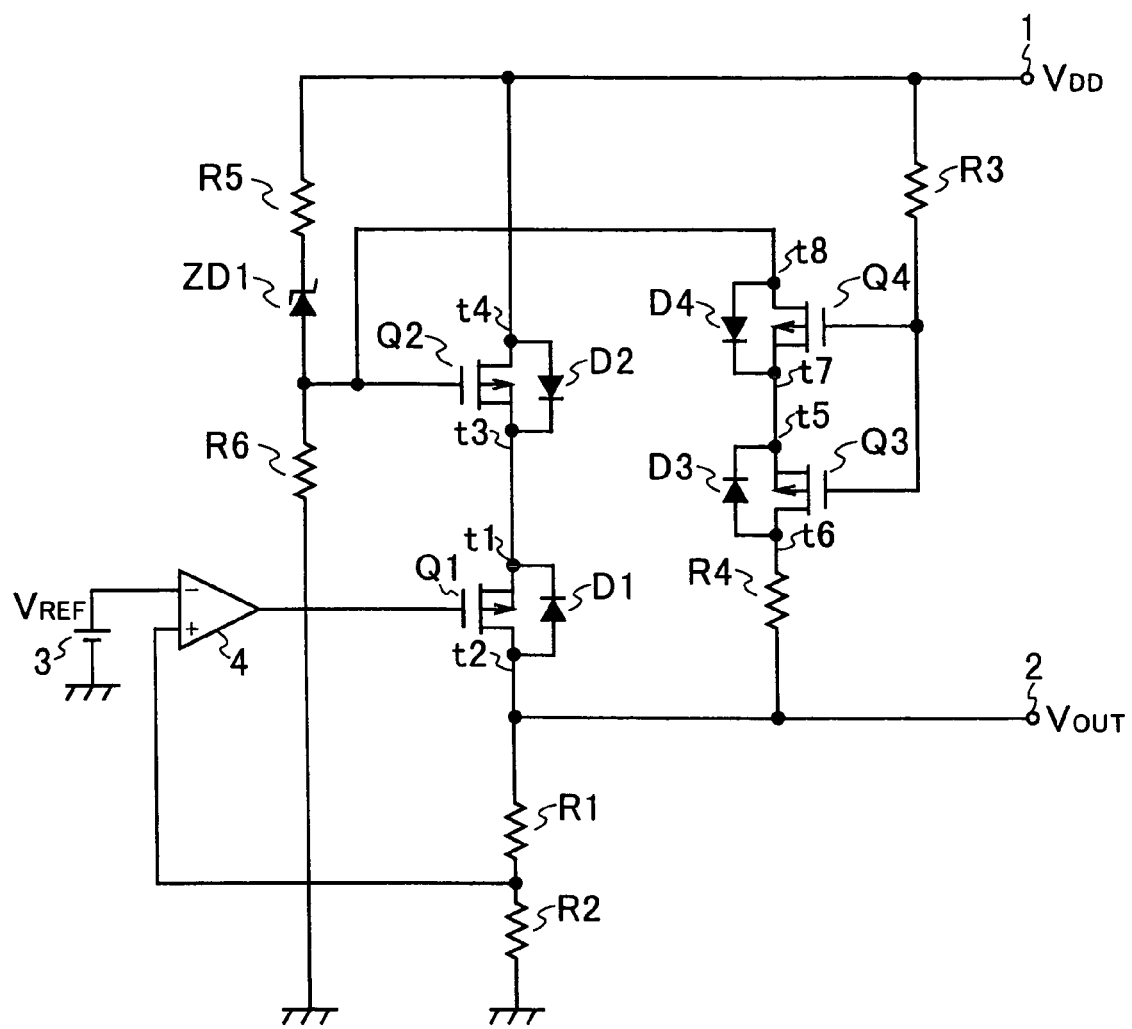
FIG. 3 is a diagram showing a practical example of the circuit configuration of the regulator shown in FIG. 2.
Figure 4:
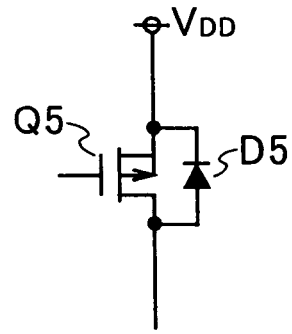
FIG. 4 is a diagram showing the P-channel MOS transistor used in a semiconductor integrated circuit.

FIG. 3 shows a practical example of the circuit configuration of the regulator shown in FIG. 2. It should be noted that, in FIG. 3, such circuit elements as are found also in FIG. 1 are identified with the same reference numerals, and their detailed explanations will not be repeated.

The gate of the MOS transistor Q2 is connected to the conducting terminal t8 of a MOS transistor Q4, the backgate and conducting terminal t7 of the MOS transistor Q4 is connected to the conducting terminal t5 and backgate of a MOS transistor Q3, and the conducting terminal t6 of the MOS transistor Q3 is connected through a resistor R4 to the output terminal 2. Here, it should be noted that, in the MOS transistor Q3, a parasitic diode D3 is formed in the direction indicated in the figure, i.e., from the conducting terminal t6 to the backgate, and that, in the MOS transistor Q4, a parasitic diode D4 is formed in the direction indicated in the figure, i.e., from the conducting terminal t8 to the backgate. One end of a resistor R3 is connected to the input terminal 1, and the other end of the resistor R1 is connected to the gate of the MOS transistor Q3 and to the gate of the MOS transistor Q4. The input terminal 1 is connected, through a resistor 5 and a Zener diode ZD1, to the gate of the MOS transistor Q2, and the gate of the MOS transistor Q2 is grounded through a resistor R6.

Here, the voltage between the gate and conducting terminal t6 of the MOS transistor Q3 is referred to in order to compare the supply voltage $V_{DD}$ and the voltage $V_{OUT}$ at the output terminal 2. This helps achieve a wider dynamic range.

In the configuration described above, in normal operation, the MOS transistor Q3 remains off, Thus, the parasitic diode D3 remains on, and accordingly, unless a current through the parasitic diode D3 is not prevented by the action of the parasitic diode D4 within the MOS transistor Q4, the gate potential of the MOS transistor Q2 does not drop to the ground level but remains equal to the voltage $V_{OUT}$ minus the $V_F$ of the MOS transistor Q3. This is prevented by the provision of the MOS transistor Q4.

In normal operation, the MOS transistors Q3 and Q4 remain off, and in addition no currents flow through the parasitic diodes D3 and D4. Thus, the gate potential of the MOS transistor Q2 is determined by the supply voltage $V_{DD}$ minus the Zener voltage of the Zener diode ZD1, and thus can be set equal to the ground potential. On the other hand, when the supply voltage $V_{DD}$ is lower than the voltage $V_{OUT}$ at the output terminal 2, the MOS transistors Q3 and Q4 remain on, and the MOS transistor Q2 remains off. Thus, no backflow current flows from the output terminal 2 to the power supply terminal 1.

The above descriptions deal only with examples in which the voltage detection circuit for detecting the voltage $V_{OUT}$ at the output terminal 2 is built as a resistance voltage division circuit. It is, however, also possible to use instead a voltage detection circuit configured in any other manner. The above descriptions deal only with examples in which the contact 5b of the switch 5 is connected to ground. It is, however, also possible to connect the contact 5b of the switch 5 to a potential other than that of ground so long as the potential is such as to turn the MOS transistor Q2 on.

What is claimed is:

1. An output stage circuit comprising:
a MOS output transistor;
a current shut-off switch; and
a comparator,
wherein the current shut-off switch is inserted between the MOS output transistor and a power terminal to which a first direct-current voltage is applied, and
wherein the comparator compares the first direct-current voltage and a second direct-current voltage outputted from the MOS output transistor so as to bring the current shut-off switch, if the first direct-current voltage is higher than the second direct-current voltage, into a conducting state and, if the first direct-current voltage is lower than the second direct-current voltage, into a non-conducting state.

* * * * *